(12) United States Patent
Lu et al.

(10) Patent No.: US 8,481,425 B2
(45) Date of Patent: Jul. 9, 2013

(54) METHOD FOR FABRICATING THROUGH-SILICON VIA STRUCTURE

(75) Inventors: Yen-Liang Lu, Kaohsiung (TW); Chun-Ling Lin, Tainan (TW); Chi-Mao Hsu, Tainan (TW); Chin-Fu Lin, Tainan (TW); Chun-Hung Chen, Tainan (TW); Tsun-Min Cheng, Changhua County (TW); Meng-Hong Tsai, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 133 days.

(21) Appl. No.: 13/108,969

(22) Filed: May 16, 2011

(65) Prior Publication Data

US 2012/0295437 A1 Nov. 22, 2012

(51) Int. Cl.
*H01L 21/44* (2006.01)

(52) U.S. Cl.
USPC .................................. 438/654; 257/E21.584

(58) Field of Classification Search
USPC .......................... 438/437, 628, 644, 645, 654
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,309,956 B1 | 10/2001 | Chiang |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |

(Continued)

*Primary Examiner* — Chandra Chaudhari
(74) *Attorney, Agent, or Firm* — Winston Hsu; Scott Margo

(57) ABSTRACT

A method for fabricating through-silicon via structure is disclosed. The method includes the steps of: providing a semiconductor substrate; forming a through-silicon via in the semiconductor substrate; covering a liner in the through-silicon via; performing a baking process on the liner; forming a barrier layer on the liner; and forming a through-silicon via electrode in the through-silicon via.

17 Claims, 2 Drawing Sheets

U.S. PATENT DOCUMENTS

| | | |
|---|---|---|
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Brigham |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,732,926 B2 | 6/2010 | Uchiyama |
| 7,846,837 B2 | 12/2010 | Kuo |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0038789 A1* | 2/2010 | Cheng et al. .................. 438/654 |
| 2010/0140749 A1 | 6/2010 | Kuo |
| 2010/0140772 A1 | 6/2010 | Lin |
| 2010/0237502 A1* | 9/2010 | Yu et al. ........................ 438/653 |
| 2010/0244247 A1 | 9/2010 | Chang |
| 2010/0323478 A1 | 12/2010 | Kuo |

* cited by examiner

METHOD FOR FABRICATING THROUGH-SILICON VIA STRUCTURE

BACKGROUND OF THE INVENTION

1. Field of the Invention

The invention relates to a method for fabricating a through-silicon via structure, and more particularly, to a method of removing excess water vapor from a liner oxide before the formation of a through-silicon via electrode.

2. Description of the Prior Art

The through-silicon via (TSV) technique is a novel semiconductor technique. The through-silicon via technique mainly servers to solve the problem of electrical interconnection between chips and belongs to a new 3D packing field. The through-silicon via technique produces products that meet the market trends of "light, thin, short and small" through the 3D stacking technique and also provides wafer-level packages utilized in micro electronic mechanic system (MEMS), and photoelectronics and electronic devices.

The through-silicon via technique drills holes in the wafer by etching or laser then fills the holes with conductive materials, such as copper, polysilicon or tungsten to form vias, i.e. conductive channels connecting inner regions and outer regions. The wafer or the dice is then thinned to be stacked or bonded together to form a 3D stack IC. By using this approach, the wire bonding procedure could be omitted. Using etching or laser to form conductive vias not only omits the wire bonding but also shrinks the occupied area on the circuit board and the volume for packing. The inner connection distance of the package created by using the through-silicon via technique, i.e. the thickness of the thinned wafer or the dice, is much shorter compared with the conventional stack package of wire bonding type. The performance of the 3D stack IC would therefore be much better in many ways, including faster transmission, and lower noise. The advantage of the shorter inner connection distance of the through-silicon via technique becomes much more pronounced in CPU, flash memory and memory card. As the 3D stack IC could be fabricated to equate the size of the dice, the utilization of through-silicon via technique becomes much more valuable in the portable electronic device industry.

Conventional approach of fabricating a TSV electrode typically forms a metal-oxide semiconductor (MOS) transistor, such as a CMOS transistor on a semiconductor substrate, forms a TSV in the interlayer dielectric layer and the semiconductor substrate, covers a liner on the sidewall of the TSV, and then fills the TSV with material such as copper for forming a TSV electrode. Unfortunately, the liner deposited in the TSV typically adsorbs water vapor during the fabrication. As a result, barrier layer and seed layer deposited thereafter could not adhere onto the surface of the liner effectively and result in issue such as copper crack.

SUMMARY OF THE INVENTION

It is an objective of the present invention to provide a method for fabricating a TSV electrode for resolving the aforementioned issue caused by conventional approach.

According to a preferred embodiment of the present invention, a method for fabricating through-silicon via structure is disclosed. The method includes the steps of: providing a semiconductor substrate; forming a through-silicon via in the semiconductor substrate; covering a liner in the through-silicon via; performing a baking process on the liner; and forming a through-silicon via electrode in the through-silicon via.

According to another aspect of the present invention, a method for fabricating through-silicon via structure is disclosed. The method includes the steps of: providing a semiconductor substrate, wherein the semiconductor substrate comprises at least a semiconductor device thereon; forming a dielectric layer on the semiconductor device; forming a through-silicon via in the dielectric layer and the semiconductor substrate; covering a liner on the sidewall and bottom of the through-silicon via; performing a baking process on the liner; forming a barrier layer, a seed layer, and a metal layer on the liner to fill the through-silicon via; and performing a planarizing process to partially remove the metal layer, the seed layer, the barrier layer, and the liner until reaching the dielectric layer for forming a through-silicon via electrode in the through-silicon via.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
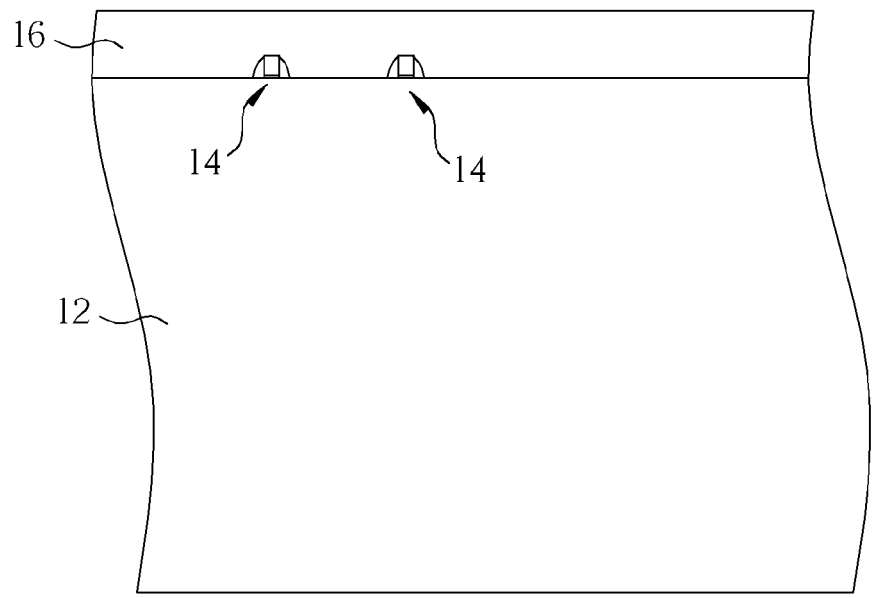
FIGS. 1-4 illustrate a method for fabricating a through-silicon via structure according to a preferred embodiment of the present invention.

Referring to FIGS. 1-4, FIGS. 1-4 illustrate a method for fabricating a through-silicon via structure according to a preferred embodiment of the present invention. As shown in FIG. 1, a semiconductor substrate 12, such as a substrate composed of monocrystalline silicon, gallium arsenide (GaAs) or other known semiconductor material is provided. A standard metal-oxide semiconductor (MOS) transistor fabrication is performed to form at least one MOS transistor 14 or other semiconductor device on the semiconductor substrate 12. The MOS transistor 14 could be a PMOS transistor, a NMOS transistor, or a CMOS transistor, and the MOS transistor 14 could also include typical transistor structures including gate, spacer, lightly doped drains, source/drain regions and/or salicides.

An interlayer dielectric layer 16 with a depth of several thousand angstroms, preferably at 3000 angstroms is deposited on the MOS transistor 14. The interlayer dielectric layer 16 is preferably a composite layer consisted of tetraethylorthosilicate (TEOS) and phosphosilicate glass (PSG), but not limited thereto. The interlayer dielectric layer 16 could also be composed of BPSG or low-k dielectric material, and a stress material layer, such as a tensile or compressive stress layer composed of silicon nitride, an etch stop layer composed of silicon nitride, a thin oxide cap layer, or combination thereof could be inserted between the interlayer dielectric layer 16 and the MOS transistor 14. A contact plug fabrication could then be conducted to form a plurality of contact plugs (not shown) in the interlayer dielectric layer 16 for electrically connecting the MOS transistors.

Figure 2:
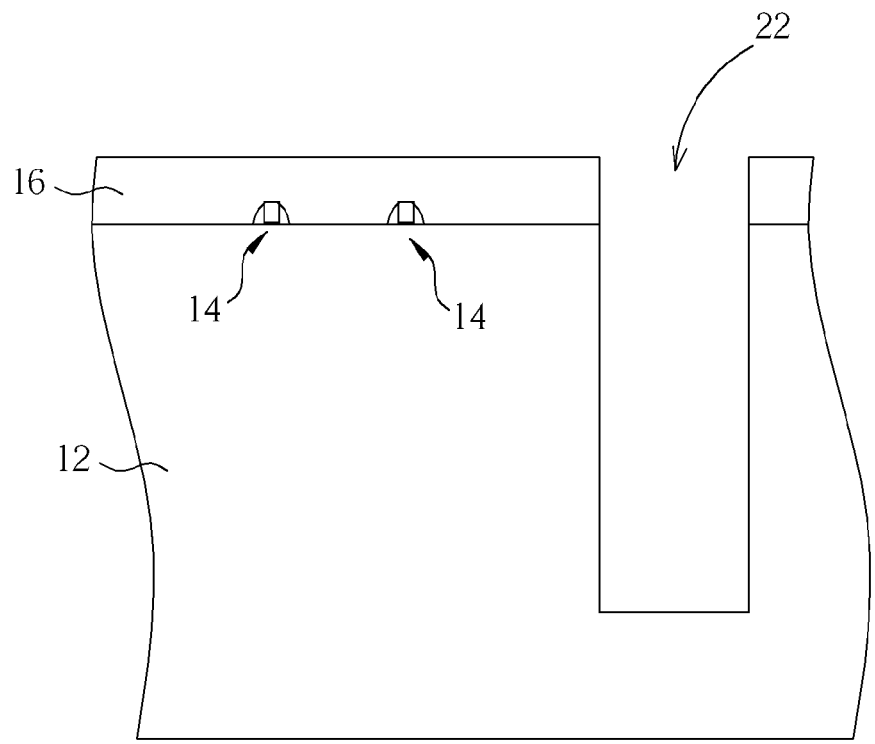

As shown in FIG. 2, a pattern transfer process is conducted thereafter by forming a patterned resist (not shown) on the interlayer dielectric layer 16 and then using this patterned resist as mask to form a through-silicon via 22 in the interlayer dielectric layer 16 and the semiconductor substrate 12 through single or multiple etching processes.

Figure 3:
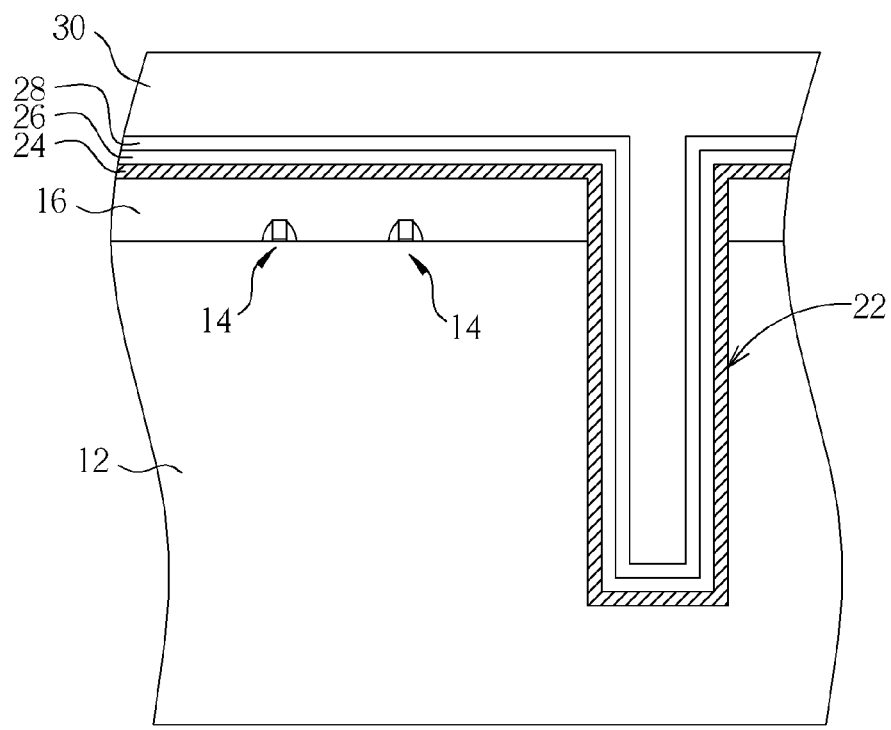

Next, as shown in FIG. 3, a liner 24 is formed on the sidewall and bottom of the through-silicon via 22 and on the surface of the interlayer dielectric layer 16. The liner 24 is preferably used as an isolation between the through-silicon via electrode afterwards and the semiconductor substrate 12, such that the through-silicon via electrode and the semiconductor substrate 12 would not contact directly. In this embodiment, the liner 24 could be composed of insulating material such as oxides or nitrides, or could be a single layer or composite layer material.

Next, a baking process is performed to remove excess water vapor from the liner 24 so that the materials deposited on the liner 24 afterwards could be adhered onto the liner 24 effectively. In this embodiment, the baking process preferably includes a furnace anneal process, in which the fabrication time of the baking process is substantially greater than 10 minutes, and the fabrication temperature of the process is between 200° C. to 500° C., and preferably at 410° C.

A chemical vapor deposition (CVD) is conducted to form a barrier layer 26 and a seed layer 28 on surface of the line 24, and a metal layer 30 composed of copper is electroplated on surface of the seed layer 28 until filling the entire through-silicon via 22. The barrier layer 26 is preferably selected from a group consisting of Ta, TaN, Ti, and TiN, which could be used to prevent copper ions of the metal layer 30 from migrating to the surrounding liner 24. The seed layer 28 is preferably used to adhere copper ions of the metal layer 30 onto the liner 24 for facilitating the copper electroplating process thereafter. It should be noted that the metal layer 30 could also be composed of conductive materials other than copper, and the seed layer 28 is formed selectively and the material of the seed layer 28 could be adjusted according to the material of the metal layer 30. An anneal process could be carried out thereafter by using a temperature between 350° C. to 400° C. to improve the stability of the metal layer 30.

Figure 4:
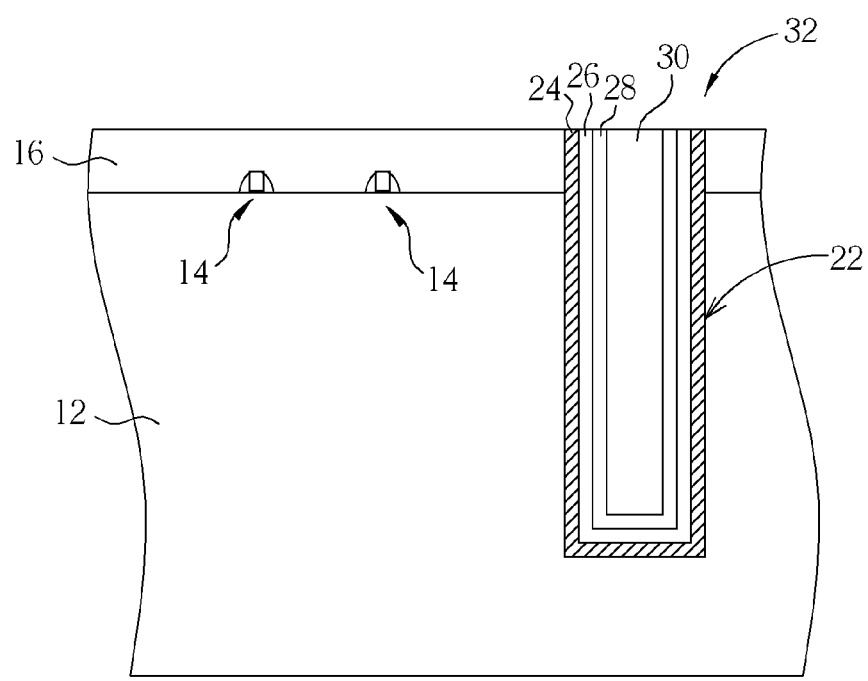

Next, as shown in FIG. 4, a planarizing process, such as a chemical mechanical polishing is conducted by using the interlayer dielectric layer 16 as a stop layer to remove a portion of the metal layer 30, the seed layer 28, the barrier layer 26, and the liner 24 such that the surface of the metal layer 30 filled within the through-silicon via 22 is even with the interlayer dielectric layer 16. This forms a through-silicon via electrode 32 in the interlayer dielectric layer 16.

Next, a back-end-of-the-line (BEOL) process for the semiconductor chip fabrication is performed. For instance, a plurality of dielectric layers (not shown) is formed on top of the interlayer dielectric layer 16 and the through-silicon via electrode 32 and associating metal interconnect fabrication and contact plug fabrication are also carried out to form metal interconnects and contact pads connecting the plugs of MOS transistor 14.

Moreover, the aforementioned embodiment could also be applied to different stage of TSV fabrication, such as during a via-first stage where a TSV filled with oxide is first formed before the formation of CMOS transistor and TSV electrode is formed on the back of the wafer thereafter, or during a via-last stage where TSV is formed after fabrication of metal interconnects is completed, which are all within the scope of the present invention.

Overall, as water vapor typically enters the liner deposited in the through-silicon via thereby creating difficulty for the seed layer and barrier layer to be adhered onto the liner as found in conventional art, the present invention specifically conducts a baking process after the formation of the liner to remove excess water vapor from the liner and reduce the stress of the entire wafer. By doing so, issues such as copper crack could be prevented effectively.

Those skilled in the art will readily observe that numerous modifications and alterations of the device and method may be made while retaining the teachings of the invention.

What is claimed is:

1. A method for fabricating through-silicon via structure, comprising:
   providing a semiconductor substrate;
   forming a through-silicon via in the semiconductor substrate;
   covering a liner in the through-silicon via;
   after performing a baking process on the liner, forming a barrier layer on the liner; and
   forming a through-silicon via electrode in the through-silicon via.

2. The method of claim 1, further comprising:
   forming a semiconductor device on the semiconductor substrate;
   forming a dielectric layer on the semiconductor device; and
   forming the through-silicon via in the dielectric layer and the semiconductor substrate.

3. The method of claim 1, further comprising forming the through-silicon via from a front side or a back side of the semiconductor substrate.

4. The method of claim 1, wherein the barrier layer is selected from a group consisting of Ta, TaN, Ti, and TiN.

5. The method of claim 1, further comprising forming a seed layer on the barrier layer after performing the baking process.

6. The method of claim 5, further comprising forming a metal layer on the seed layer after performing the baking process.

7. The method of claim 6, wherein the metal layer comprises copper.

8. The method of claim 6, further comprising performing a planarizing process to partially remove the metal layer, the seed layer, the barrier layer, and the liner after forming the metal layer.

9. The method of claim 8, wherein the planarizing process comprises a chemical mechanical polishing process.

10. The method of claim 2, wherein the semiconductor device comprises a CMOS transistor.

11. A method for fabricating through-silicon via structure, comprising:
    providing a semiconductor substrate, wherein the semiconductor substrate comprises at least a semiconductor device thereon;
    forming a dielectric layer on the semiconductor device;
    forming a through-silicon via in the dielectric layer and the semiconductor substrate;
    covering a liner on the sidewall and bottom of the through-silicon via;
    after performing a baking process on the liner, forming a barrier layer, a seed layer, and a metal layer on the liner to fill the through-silicon via; and
    performing a planarizing process to form a through-silicon via electrode in the through-silicon via.

12. The method of claim 11, wherein the barrier layer is selected from a group consisting of Ta, TaN, Ti, and TiN.

13. The method of claim 11, wherein the metal layer comprises copper.

14. The method of claim 11, wherein the planarizing process comprises a chemical mechanical polishing process.

15. The method of claim 11, wherein the semiconductor device comprises a CMOS transistor.

16. The method of claim 11, further comprising forming the through-silicon via from a front side or a back side of the semiconductor substrate.

17. The method of claim 11, wherein the planarizing process comprises partially removing the metal layer, the seed layer, the barrier layer, and the liner until reaching the dielectric layer.

* * * * *